United States Patent

[11] 3,602,840

[72] Inventors Jun-ichi Nishizawa;
Takeaki Okabe; Kotaro Okamoto, all of Sendai-shi, Japan

[21] Appl. No. 846,401
[22] Filed July 31, 1969
[45] Patented Aug. 31, 1971
[73] Assignee Semiconductor Research Foundation Sendai-shi, Japan
[32] Priority Aug. 1, 1968
[33] Japan
[31] 43-54536

[54] TRANSIT TIME DIODE OSCILLATOR USING TUNNEL INJECTION
13 Claims, 13 Drawing Figs.

[52] U.S. Cl. 331/96, 317/234 V, 317/235 L, 317/235 AD, 317/235 AM, 317/235 AN, 331/107 R, 331/107 T
[51] Int. Cl. H03b 7/14
[50] Field of Search 331/107, 107 T, 96; 317/234, 235; 307/318

[56] References Cited

UNITED STATES PATENTS

| | | | |
|---|---|---|---|
| 3,270,293 | 8/1966 | DeLoach, Jr. et al. | 331/107 |
| 3,461,356 | 8/1969 | Yamashita et al. | 317/234 |
| 3,466,512 | 9/1969 | Seidel | 317/235 |
| 3,483,441 | 12/1969 | Hofflinger | 331/107 X |

*Primary Examiner*—Roy Lake
*Assistant Examiner*—Siegfried H. Grimm
*Attorneys*—Curt M. Avery, Arthur E. Wilfond, Herbert L. Lerner and Daniel J. Tick

ABSTRACT: An operating voltage is applied to a pair of electrodes in electrical contact with a semiconductor substrate having two zones of opposite conductivity type forming a PN junction in a reverse direction across such junction in a manner whereby a space charge region is formed by the operating voltage and a carrier is injected into the space charge region due to tunnel effect. The carrier transits the space charge region and decreases the internal electric field to such an extent that the succeeding carrier injection may be controlled and avalanche breakdown substantially does not occur.

PATENTED AUG 31 1971 3,602,840

TRANSIT TIME DIODE OSCILLATOR USING TUNNEL INJECTION

DESCRIPTION OF THE INVENTION

The present invention relates to a transit time diode oscillator. More particularly, the invention relates to a transit time diode oscillator having a tunnel effect injection junction portion.

Diodes of the type of Read and avalanche diodes have been utilized as bulk oscillating elements to replace klystron oscillators of intermediate and small outputs including millimeter waves and are now widely utilized in a practical manner. A higher oscillator frequency cannot be provided by the Read diode, because its structure is complicated and its manufacture is very difficult. The avalanche diode, on the other hand, may be manufactured with facility, but does not permit effective avalanche injection in an extremely narrow space charge layer.

The principal object of the present invention is to provide a new and improved transit time diode oscillator, which overcomes the deficiencies of known similar types of oscillator which functions at a high oscillation frequency.

An object of the present invention is to provide a transit time diode oscillator having an injection portion which provides effective carrier injection at frequencies above 100 gigaHertz.

An object of the present invention is to provide a transit time diode oscillator of novel injection type which provides effective carrier injection at frequencies above 100 gigaHertz without utilizing avalanche injection.

An object of the present invention is too provide a transit time diode oscillator which is stable, efficient, effective and reliable in operation.

An object of the present invention is to provide a transit time diode oscillator which provides oscillations of greater than 100 gigaHertz at an operating voltage lower than an IMPATT diode.

In accordance with the present invention, a transit time diode oscillator of novel injection type utilizes tunnel injection instead of avalanche injection. This is based on the fact that in an extremely narrow space charge layer or region, avalanche injection cannot be provided effectively, but tunnel injection can be provided with considerable facility and stability.

In accordance with the present invention, a transit time diode oscillator comprises a semiconductor substrate having two zones of opposite conductivity type forming a PN junction. A pair of electrodes are in electrical contact with the semiconductor substrate. Voltage means connected to the electrodes apply to the electrodes an operating voltage in a reverse direction across the PN junction in a manner whereby a space charge region is formed by the operating voltage and a carrier is injected into the space charge region due to tunnel effect, transits the space charge region and decreases the internal electric field to such an extent that the succeeding carrier injection may be controlled and avalanche breakdown substantially does not occur.

The semiconductor substrate may comprise silicon, germanium, gallium arsenide or indium antimonide.

A transit time diode oscillator of the present invention comprises a semiconductor substrate of one conductivity type having a high impurity concentration. A high resistance layer of the same conductivity type as the substrate is formed on the substrate to a thickness of approximately 0.5 to 20.0 microns. A semiconductor layer of the same conductivity type as the substrate is formed on the high resistance layer. The semiconductor layer has an impurity distribution which is such that the impurity concentration increases as the distance from the high resistance layer increases. The impurity concentration increases from $10^{17}$/cm.$^3$ to $10^{20}$/cm.$^3$. A recrystallized semiconductor layer of opposite conductivity type from the substrate is joined to form a PN junction with the substrate. The recrystallized semiconductor layer has an impurity concentration of $10^{17}$/cm.$^3$ to $10^{20}$/cm.$^3$. A first electrode is ohmically connected with the substrate. A second electrode is ohmically connected with the recrystallized semiconductor layer. Voltage means connected to the first and second electrodes applies to the electrodes an operating voltage in a reverse direction across the PN junction in a manner whereby a space charge region is formed by the operating voltage and a carrier is injected into the space charge region due to tunnel effect, transits the high resistance layer and decreases the internal electric field to such an extent that the succeeding carrier injection may be prevented and avalanche breakdown does not occur spontaneously.

A transit time diode oscillator of the present invention comprises a semiconductor substrate of one conductivity type uniformly doped at a concentration of $10^{18}$/cm.$^3$ to $10^{20}$/cm.$^3$. A semiconductor layer of opposite conductivity type from the substrate is joined and forms an abrupt type PN junction with the substrate. The semiconductor layer is doped at a concentration of $10^{18}$/cm.$^3$ to $10^{21}$/cm.$^3$. A first electrode is ohmically connected to the semiconductor substrate. A second electrode is ohmically connected to the semiconductor layer. Voltage means connected to the first and second electrodes applies to the electrodes an operating voltage in a reverse direction across the PN junction in a manner whereby a space charge region is formed by the operating voltage and a carrier is injected into the space charge region due to tunnel effect, transits the space charge region and decreases the internal electric field to such an extent that the succeeding carrier injection may be prevented and avalanche breakdown does not occur spontaneously.

In accordance with the present invention, the transit time diode oscillator comprises a compound semiconductor material of direct transition type and of large mobility such as, for example, gallium arsenide, indium antimonide, germanium or silicon. The PN junction is reverse biased relative to the operating voltage. The operating voltage forms a space charge region and a carrier is injected into the narrow space charge region of the junction by the tunnel effect. The carrier is attracted toward two electrodes by the electric field but, at the same time, decreases the internal electric field and controls the tunnel injection. When the carrier terminates its transit through the space charge region, the injection operation of the high electric field at the junction is increased to a magnitude sufficient to provide tunnelling and the tunnel injection of the carrier resumes. The repetition corresponds to the period of oscillation of the diode and provides current oscillations of extremely high frequencies and induces an electromagnetic field in the external circuit.

In order that the present invention may be readily carried into effect, it will now be described with relation to the accompanying drawings, wherein:

FIGS. 1*a*, 1*b* and 1*c* illustrate the impurity distribution, the electric field distribution and the energy band, respectively, of a PNIN diode of the present invention provided with a tunnel injection junction;

FIG. 2 is a sectional view of a point contact diode having a single tunnel injection junction;

FIGS. 3*a*, 3*b* and 3*c* illustrate the impurity distribution, electric field distribution and energy band, respectively, of an abrupt PN diode of the present invention in which tunnel injection is provided;

Figure 6A:
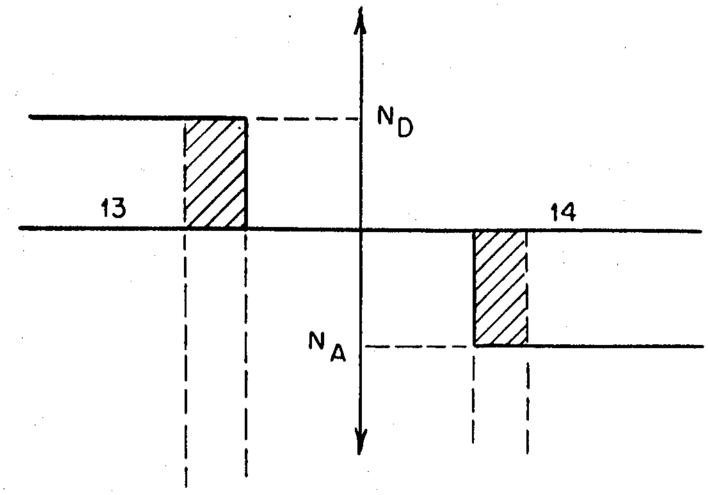
Figure 6B:
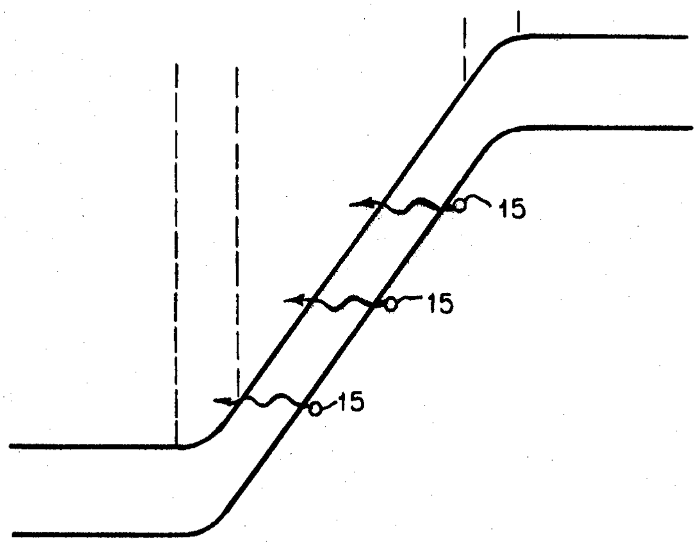
Figure 7A:
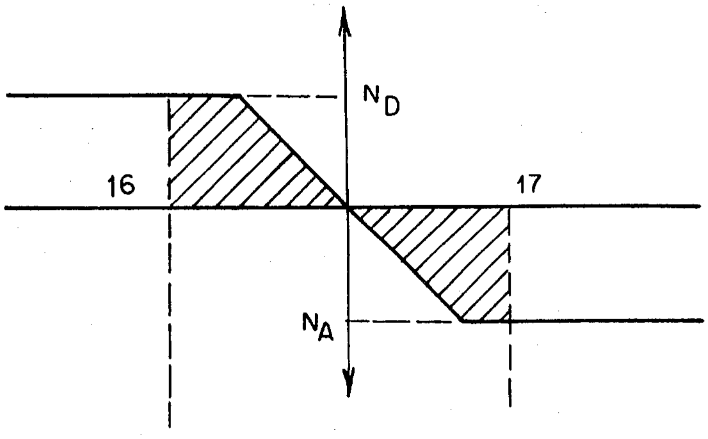
Figure 7B:
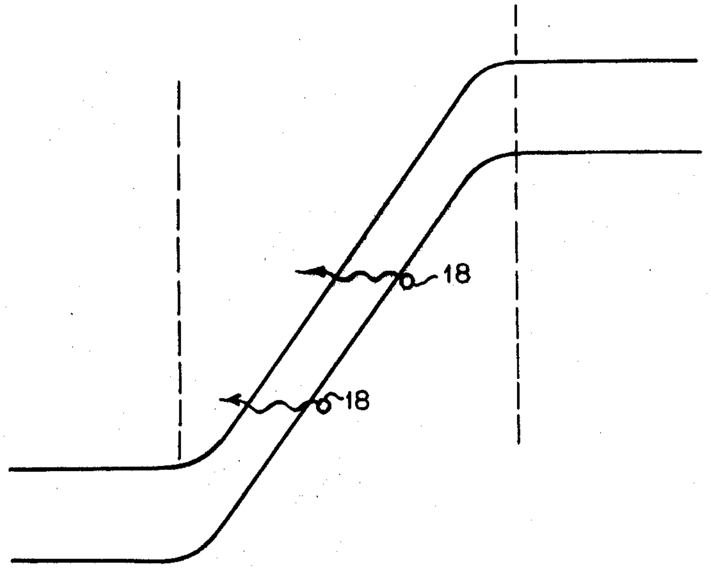

FIGS. 6*a* and 6*b* illustrate the impurity distribution and energy band, respectively, of an abrupt type junction diode of the present invention wherein tunnel injection is provided in all the areas of the junction; and FIGS. 7a and 7b show the impurity distribution and energy band, respectively, of a diode having a structure which approximates that of a graded junction diode of the type of FIGS. 6a and 6b.

Figure 1A:
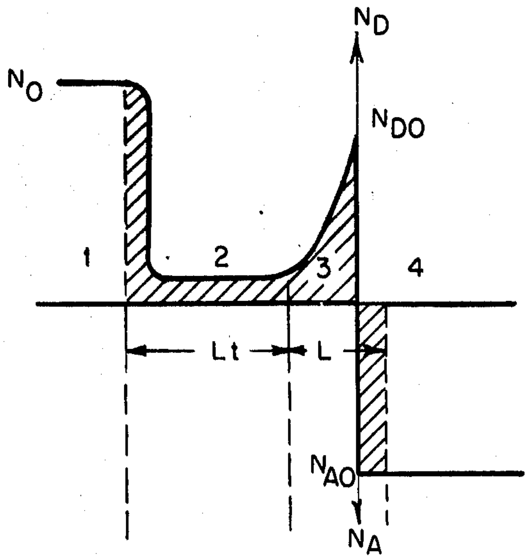
Figure 1B:
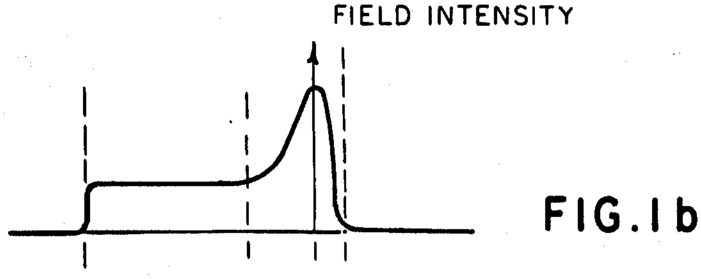
Figure 1C:
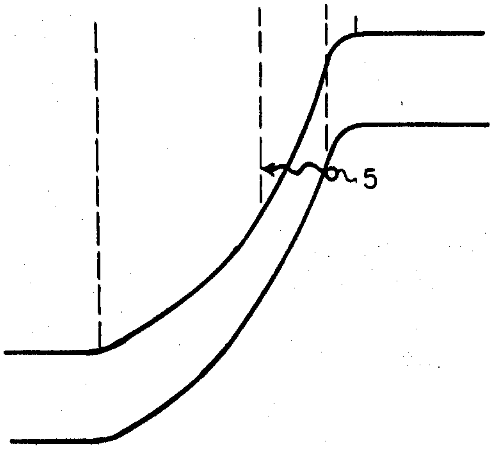

FIGS. 1a, 1b and 1c illustrate the impurity distribution, electric field distribution and energy band of a diode having a structure similar to that of a Read diode. The diode of FIGS. 1a, 1b and 1c comprises an N layer 1, an I layer 2, an N layer 3 and a P layer 4. Electrons 5 are tunnel injected from the valance band of the P layer to the conduction band of the N layer. The junction in the PN junction portion is biased in the reverse direction by the operating voltage and tunnel breakdown occurs. The width L of the high electric field region is so selected that the avalanche may not increase well.

The donor density $N_{DO}$ and the acceptor density $N_{AO}$ of the PN junction portion are thereby determined. The carrier is produced by the tunnel breakdown. That is, electrons transit or traverse the I layer, which is the main transit region, and if the distance $L_t$ is so determined that a phase shifting rotation of approximately $3\pi/2$ may be provided during the transit of the electrons, a negative resistance is provided between the two electrode terminals. For this reason, the I layer must have a high electric field which is such that said I layer is punched through and the carrier arrives at the saturated speed when the I layer is reversed or oppositely biased. Here, however, an electron avalanche does not substantially occur. It is desirable that the backward or reverse current increase rapidly after the I layer is punched through. The tunnel breakdown satisfies this requirement.

Examples of numerical values utilized to provide a diode of the structure of FIG. 1, utilizing silicon, are as follows:

| | | Possible Range |
|---|---|---|
| $N_{DO}$ | 5 times $10^{18}$/cm.$^3$ | $10^{17}$ to $10^{20}$/cm.$^3$ |
| $N_{AO}$ | 2 times $10^{19}$/cm.$^3$ | $10^{17}$ to $10^{20}$/cm.$^3$ |
| L | 200 A. | under 800 A. |
| $L_t$ | 5 $\mu$ | 0.5 to 20 $\mu$ |
| $N_b$ | $10^{14}$/cm.$^3$ | $10^{14}$ to $10^{16}$/cm.$^3$ |

wherein $N_{DO}$ is the donor density, $N_{AO}$ is the acceptor density, L is the width of the space charge region, $L_t$ is the transit distance and $N_b$ is the impurity concentration.

Obviously, the impurity distribution of FIG. 1 may also be realized with semiconductor materials other than silicon by utilizing well known methods such as, for example, the alloy after diffusion method, which first diffuses impurities to produce a conductivity type similar to that of the impurities added to the semiconductor material. An alloy material including a considerable amount of impurities of a conductivity type opposite to the first conductivity type is then alloyed to the semiconductor material to form a PN junction. The alloyed diffusion method, which provides alloying and diffusion simultaneously by utilizing material which includes acceptor and donor impurities, may also be utilized. Other methods which may be utilized are the double diffusion method, the melt back method and the epitaxial growth method, which provides the desired impurity concentration distribution by properly adding impurities during the gaseous phase growth of the crystal.

In such methods, a P conductivity type high resistance layer having a thickness of 30 microns is formed by the epitaxial growth method on a substrate wafer of P conductivity type silicon which is doped with boron at a concentration of 1 times $10^{20}$/cm$^3$. The resistivity of the epitaxial layer must be greater than 0.5 ohm cm. The substrate wafer is then diced into pellets of 4 mm$^2$.

Dots comprising an alloy of silver, lead, antimony and aluminum, having a ratio by weight of 20:20:10:1, are placed on the surfaces of the epitaxial layer of the pellets. Alloying and diffusion are simultaneously effected within a vacuum of 2 times $10^{16}$ to 10 times $10^{16}$ Torr at a temperature of 950° C. for 20 minutes. It is important to provide a control so that the depth of the interface between the liquid phase and the solid phase, which proceeds in the epitaxial growth layer during the alloy process, may become the desired magnitude. In the present example, this depth was 25 microns.

An ohmic electrode is they affixed to the back surface of the wafer by utilizing a eutectic alloy foil of aluminum and silicon as a solder and provided heat treatment in order to alloy such foil to a nickel plated molybdenum plate in a vacuum of 2 to 10 times $10^{16}$ Torr at a temperature of 750° C. for 10 minutes. The NPIP diode thus fabricated is then mounted in a cavity resonator and the operating voltage of rectangular pulses is applied in the backward direction of the diode. Microwave oscillation by tunnel injection is thus provided. Oscillation at a frequency of 256 gigaHertz and an output of 1 milliwatt may be provided at an operating voltage of 8 volts. The fact that the carrier injection is due to the tunnel effect is confirmed by the fact that the operating voltage is decreased by an increase in ambient temperature.

In another method for obtaining the impurity distribution of FIG. 1a, a P conductivity type high resistance layer of gallium arsenide, having an impurity concentration of about $10^{16}$/cm.$^3$, is formed to a thickness of 20 microns on a gallium arsenide substrate wafer having a (100) surface doped with zinc at a concentration of 2 times $10^{19}$/cm.$^3$ by the epitaxial growth method. The wafer is inserted into a transparent quartz ampul and zinc diffusion is provided in a vacuum of 2.5 times $10^{16}$ Torr at a temperature of 850° C. for 3 hours.

The arsenic is sealed in the ampul in order to prevent decomposition of gallium arsenide during the heat treatment for diffusion. In the diffusion treatment, zinc is diffused not only from the surface of the growth layer of gallium arsenide, but also from the side of the wafer doped with zinc at a high concentration in the epitaxial layer of low concentration. The result is that the width of the region of low impurity concentration within the epitaxial layer is gradually narrowed. In the present embodiment, the width of the region of low impurity concentration was 5 microns. This, however, may be varied in accordance with the design of the device.

Tin is then evaporated into the surface of the epitaxial layer to form a PN junction. Indium is evaporated on the back surface of the wafer to provide an ohmic contact and it is then alloyed by heat treatment within a vacuum at a temperature of 500° C. for 5 minutes. The wafer is then cut into 1 mm.$^2$ dimensions and a NPIP diode is fabricated. If the NPIP diode is mounted in a microwave cavity and biased by an operating voltage in the backward direction, microwave oscillation by tunnel injection is provided.

Figure 2:
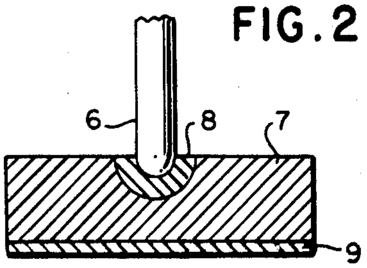

Although the aforedescribed method provides a diode of NPIP structure, millimeter wave oscillation may also be provided by a similar method which produces a diode of PNIN structure. A similar operation may be provided with a point contact structure, as shown in FIG. 2, instead of the impurity distribution of FIG. 1a. In FIG. 2, a metal electrode 6 is electrically connected with a semiconductor substrate 7 via a rectifying contact. An electrode layer 9 is ohmically connected with the substrate 7.

When an operating voltage is applied between the electrodes 6 and 9 in the reverse direction to the junction, electrons are injected from the side of the metal electrode 6 into the space charge region 8 due to the tunnel effect. The electrons traverse or transit the space charge region 8. The injected carrier decreases the electric field in the space charge region 8 and prevents the succeeding carrier injection. A negative resistance is provided when the phase is delayed by $\pi/2$ to $3\pi/2$, due to the delayed time of such transit.

Figure 3A:
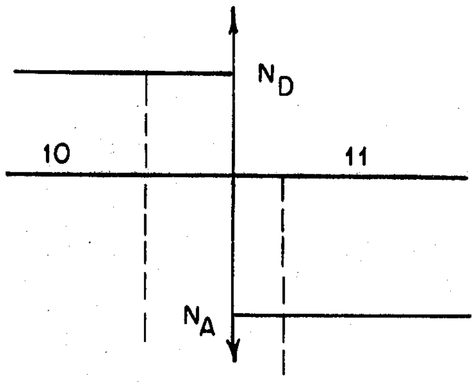
Figure 3B:
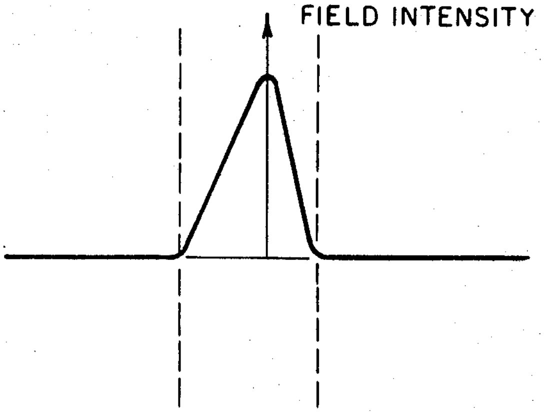
Figure 3C:
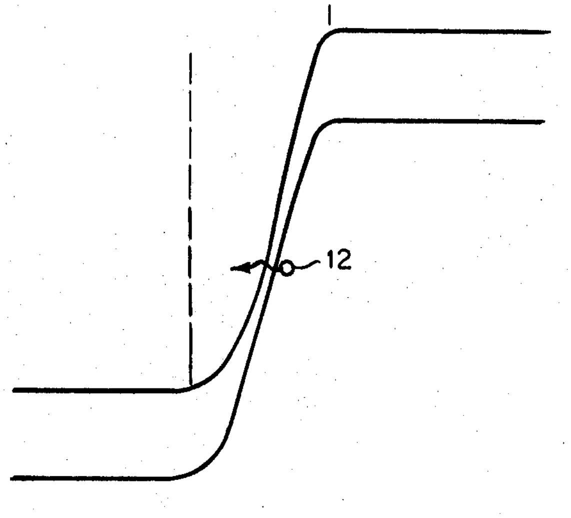

In FIGS. 3a, 3b and 3c, an operating voltage is applied to an abrupt type junction formed by a layer 10 of N conductivity type and a layer 11 of P conductivity type in the reverse or backward direction. Carrier injection is provided in the central portion of the junction where the field strength is the greatest, due to tunnel effect. Consequently, the field strength of the injection point in the central portion of the junction is decreased by the electric field provided by the carrier and the succeeding tunnel injection is prevented. The space charge region is not shown in the FIGS.

By the time the transit or traverse of the injected carrier through the space charge region is terminated, the field strength of the injection point is restored to a magnitude large enough to provide tunnel injection. Thus, current oscillation is produced by the tunnel injection, thereby preventing the effect of the carrier itself and the effect of the transit time of said carrier.

In the embodiment of FIGS. *3a*, *3b* and *3c*, oscillation may be produced by tunnel injection if the maximum electric field Em in reverse bias is large enough to produce tunnel breakdown, and the width L of the space charge region is narrow enough to prevent the growth of an avalanche. The frequency of oscillation is determined by the width L of the space charge region, so that oscillation at a higher frequency is therefore possible. The oscillation may thus have a frequency of, for example, 100 to 1000 gigaHertz.

The impurity concentration of a silicon diode in which oscillation is produced by tunnel injection is as follows:

| | | Possible Range |
|---|---|---|
| $N_A$ | 2 times $10^{18}$/cm.$^3$ | $10^{18}$ to $10^{21}$/cm.$^3$ |
| $N_D$ | 5 times $10^{19}$/cm.$^3$ | $10^{18}$ to $10^{21}$/cm.$^3$ |
| L | 500 A. | under 800 A. |

The diode oscillator of the embodiment of FIGS. *3a*, *3b* and *3c* was fabricated by growing an N conductivity type gallium arsenide layer on a substrate wafer of gallium arsenide of P conductivity type having an impurity concentration of $10^{18}$ to $10^{20}$/cm.$^3$ by the solution growth method. More particularly, the surface of a gallium arsenide substrate wafer of P conductivity type, having a (100) surface doped with zinc at a concentration of 1 times $10^{19}$/cm.$^3$, is finished to a mirror face by mechanical polishing and chemical etching. The substrate wafer is placed on one end of a furnace tube comprising transparent quartz.

A saturation solution is dissolved at a temperature of 710° C. into a solvent metal comprising an alloy of tin of 1.5 grams and gallium of 1.5 grams. The solvent metal alloy is placed on the other end of the furnace tube of transparent quartz. The furnace tube is then inclined so that the dissolved metal may cover the substrate wafer. The furnace tube is then cooled at a rate of 10° C./minute to grow a gallium arsenide single crystal layer of N conductivity type having a thickness of 30 microns. The single crystal layer of gallium arsenide includes donor impurities of tin of 2 to 5 times $10^{18}$/cm.$^3$.

Both surfaces of the wafer are then lightly lapped with carborundum powder and the ohmic electrodes are then affixed. The wafer is first nickel plated, for example, and is then heated for approximately 10 minutes in a vacuum of $10^{16}$ Torr at a temperature of 550° C. The wafer is then again nickel plated and is further gilded and the electrode is completely formed.

Figure 4:
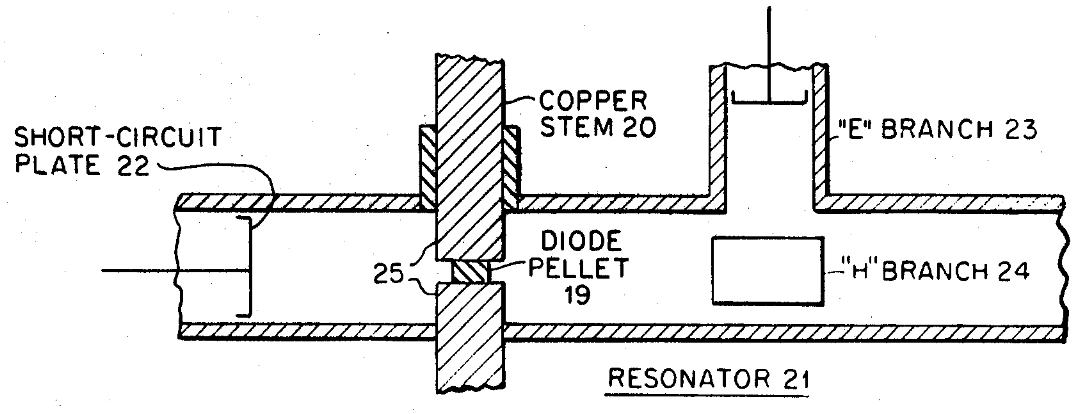
FIG. 4 is a view, partly in section, of a central part of an resonator utilized in an embodiment of a transit time diode oscillator of the present invention.

The wafer is cut into squares or rectangles, which are pellets. The area of each of the pellets may be, for example, 4 times $10^{14}$ to $10^{15}$ cm$^2$. As shown in FIG. 4, one of the diode pellets 19 may then be soldered to the end surface of a copper stem 20 and may be mounted in a resonator 21.

The resonator 21 of FIG. 4 comprises a short circuit plate 22, an E branch 23 and an H branch 24. Parts 25 are provided in the central area of the resonator 21. The resonator satisfies the condition of high impedance as against low frequency oscillations, and satisfies the condition of low impedance as against high frequency oscillations.

The height of the resonator 21 is 1.27 mm. The width of the resonator is 2.54 mm. The length of the resonator is variable within the range of 60 mm. to 75 mm. When a pulse voltage having a pulse duration of 100 nanoseconds at 100 pulses per second was applied to the diode in a manner wherein said diode was reverse biased, oscillation at a frequency of 129 gigaHertz was provided. The bias current density was 2 times $10^5$ amperes/cm.$^2$ and the output was 1 milliwatt. The maximum electric field of the space charge region or layer approached 3 times $10^6$ to $10^7$ volts/cm.

Figure 5:
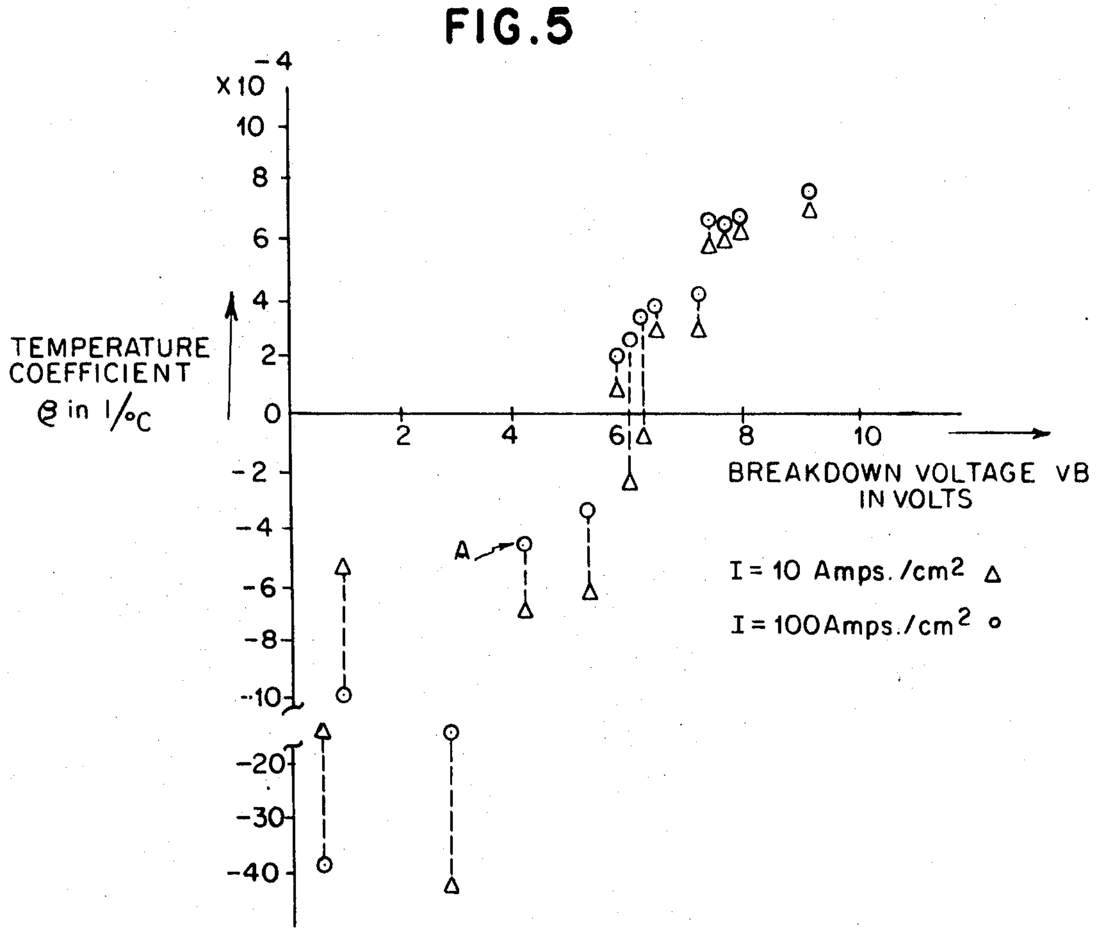
FIG. 5 is a graphical presentation showing the relationship between the breakdown voltage and the temperature coefficient of the impressed voltage when the current density is 10 amperes/cm.$^2$ and 100 amperes/cm.$^2$.

Diodes having different operating voltages may be fabricated or manufactured in the same manner as the aforedescribed. The relation between the breakdown voltage $V_B$ and the temperature coefficient $\beta$(T) of the applied voltage of each of the diodes of different operating voltages, when the current density I is 10 amperes/cm.$^2$ and 100 amperes/cm.$^2$, is shown in FIG. 5. In FIG. 5, the abscissa represents the breakdown voltage $V_B$ in volts and the ordinate represents the temperature coefficient $\beta$ in 1/° C.

In FIG. 5, A indicates a sample which permits an oscillation of 129 gigaHertz to be produced. The fact that the temperature coefficient $\beta$(T) is negative indicates that breakdown due to tunnel effect is dominant. The oscillation initiating voltage of the sample A is 35 volts, but is is known from the forward characteristic of the diode that there is a series resistance. Therefore, if the series resistance is taken into consideration, it is seen that the designated breakdown voltage is being applied to the junction. Oscillation at a very high frequency may thus be provided by the injection of carrier due to tunnel effect.

Although gallium arsenide of P conductivity type has been described for the diode in the foregoing, the same effect may be provided by gallium arsenide of N conductivity type or by the utilization of silicon, germanium or gallium phosphorate.

FIGS. *6a* and *6b* illustrate the impurity distribution and energy band, respectively, of a diode in which tunnel injection is provided in all the areas of the junction. In the diode of FIGS. *6a* and *6b*, the injection region of the transit region are coexistent and the diode is suitable for providing oscillation at higher frequencies. The diode comprises a layer 13 of N conductivity type and a layer 14 of P conductivity type. Electrons 15 are tunnel injected electrons. The junction of the diode of FIGS. *6a* and *6b* may be approximated with the graded junction of FIG. *7a*.

The diode of FIGS. *7a* and *7b* is essentially similar to that of FIGS. *6a* and *6b*. The diode of FIGS. *7a* and *7b* has a graded junction and comprises a layer 16 of N conductivity type and a layer 17 of P conductivity type. The electrons 18 are tunnel injected electrons.

As evident from the foregoing explanation, in accordance with the present invention, a reverse bias voltage is applied to a very narrow junction and a carrier is injected by the tunnel effect. The carrier is caused to traverse or transit the space charge region or layer of the junction. At the same time the maximum electric field is decreased and the succeeding tunnel injection is prevented by the electric field provided by the injected carrier. Oscillations of superhigh frequencies may be provided by the transit time effect of the carrier.

When there is injection due to tunnel effect, the breakdown voltage is lower than when there is avalanche injection. Therefore, less electric power is required, so that a diode oscillator of excellent efficiency and high reliability may be provided. A small magnitude of avalanche current sometimes flows together with tunnel current but this does not disadvantageously affect the essential effect of the diode oscillator of the present invention.

Although various types of semiconductor material which may be utilized in the diode oscillator of the present invention have been disclosed herein, any suitable semiconductor material may be utilized. In order to provide the tunnel effect with greater facility, and to provide high frequency operation, it is preferable to utilize semiconductor materials having great mobility in the transit region. Thus, compound semiconductor materials of direct transition type and of great mobility such as, for example, gallium arsenide and indium antimonide, are preferable. Furthermore, silicon and germanium may be utilized as the semiconductor material, although silicon has a higher stability than germanium.

While the invention has been described by means of specific exampled and in specific embodiments, we do not wish to be limited thereto, for obvious modifications will occur to those skilled in the art without departing from the spirit and scope of the invention.

We claim:

1. A transit time diode oscillator, comprising a semiconductor body having a semiconductor region of one conductivity type and a semiconductor region of the opposite conductivity type, said regions forming a PN junction and having impurity concentrations greater than $10^{17}/cm.^3$ in the vicinity of the PN junction; a pair of electrodes each electrically connected to a corresponding one of the semiconductor regions; and voltage means connected to the electrodes for applying to said electrodes an operating voltage in a reverse direction across the PN junction in a manner whereby a space charge region is formed and a high electric field portion is formed in the vicinity of and covering the PN junction, said electric field portion having a width under 800 Angstrom thereby causing tunnel injection, and whereby carriers are injected into the space charge region due to tunnel effect, transit the space charge region and decrease the internal electric field to such an extent that the succeeding carrier injection may be controlled and avalanche breakdown substantially does not occur.

2. A transit time diode oscillator as claimed in claim 1, wherein said semiconductor body comprises silicon.

3. A transit time diode oscillator as claimed in claim 1, wherein said semiconductor body comprises germanium.

4. A transit time diode oscillator as claimed in claim 1, wherein said semiconductor body comprises gallium arsenide.

5. A transit time diode oscillator as claimed in claim 1, wherein said semiconductor body comprises indium antimonide.

6. A transit time diode oscillator comprising a semiconductor substrate of one conductivity type having a high impurity concentration; a high resistance layer of the same conductivity type as said substrate formed on said substrate to a thickness of approximately 0.5 to 20.0 microns; a semiconductor layer of the same conductivity type as said substrate formed on said high resistance layer to a thickness of approximately under 800 Angstrom, said semiconductor layer having an impurity distribution which is such that the impurity concentration increases as the distance from said high resistance layer increases, said impurity concentration increasing from the impurity concentration of the high resistance layer to $10^{17}/cm.^3$ to $10^{20}/cm.^3$; a recrystallized semiconductor layer of opposite conductivity type from said semiconductor layer joined and forming a PN junction with said semiconductor layer, said recrystallized semiconductor layer having a thickness of approximately above 800 Angstrom and an impurity concentration of $10^{17}/cm.^3$ to $10^{20}/cm.^3$; a first electrode ohmically connected with said substrate; a second electrode ohmically connected with said recrystallized semiconductor layer; and voltage means connected to said first and second electrodes for applying to said electrodes an operating voltage in a reverse direction across said PN junction in a manner whereby a space charge region is formed by said operating voltage and a carrier is injected into said space charge region due to tunnel effect, transits the high resistance layer and decreases the internal electric field to such an extent that the succeeding carrier injection may be prevented and avalanche breakdown does not occur spontaneously.

7. A transit time diode oscillator as claimed in claim 6, wherein said semiconductor substrate comprises silicon.

8. A transit time diode oscillator as claimed in claim 6, wherein said semiconductor substrate comprises germanium.

9. A transit time diode oscillator as claimed in claim 6, wherein said semiconductor substrate comprises gallium arsenide.

10. A transit time diode oscillator comprising a semiconductor substrate of one conductivity type uniformly doped at a concentration of $10^{18}/cm.^3$ to $10^{21}/cm.^3$; a semiconductor layer of opposite conductivity type from said substrate joined and forming an abrupt type PN junction with said substrate, said semiconductor layer being doped at a concentration of $10^{18}/cm.^3$ to $10^{21}/cm.^3$; a first electrode ohmically connected with said semiconductor substrate; a second electrode ohmically connected to said semiconductor layer; and voltage means connected to said first and second electrodes for applying to said electrodes an operating voltage in a reverse direction across said PN junction in a manner whereby a space charge region having a width of under 800 Angstrom is formed by said operating voltage and a high electric field is formed in the space charge region thereby causing tunnel effect, and whereby carriers are injected into said space charge region due to tunnel effect, transit said space charge region and decrease the internal electric field to such an extent that the succeeding carrier injection may be prevented and avalanche breakdown does not occur spontaneously.

11. A transit time diode oscillator as claimed in claim 10, wherein said semiconductor substrate comprises silicon.

12. A transit time diode oscillator as claimed in claim 10, wherein said semiconductor substrate comprises germanium.

13. A transit time diode oscillator as claimed in claim 10, wherein said semiconductor substrate comprises gallium arsenide.